United States Patent [19]

Naito

[11] Patent Number: 5,440,569
[45] Date of Patent: Aug. 8, 1995

[54] FLIP-FLOP CIRCUITS FOR TESTING LSI GATE ARRAYS

[75] Inventor: Mitsugu Naito, Kawasaki, Japan
[73] Assignee: Fujitsu Limited, Kawasaki, Japan
[21] Appl. No.: 195,606
[22] Filed: Feb. 14, 1994

Related U.S. Application Data

[63] Continuation of Ser. No. 710,829, Jun. 5, 1991, abandoned.

[30] Foreign Application Priority Data

Jun. 6, 1990 [JP] Japan .................................. 2-147751

[51] Int. Cl.⁶ .......................................... H04B 17/00
[52] U.S. Cl. .................................. 371/22.3; 371/22.5
[58] Field of Search ..................................... 371/22.3

[56] References Cited

U.S. PATENT DOCUMENTS 4,856,002  9/1989  Sakashita et al. ..................... 371/21
4,870,345  9/1989  Ichiro et al. ........................ 371/22.3
5,047,710  9/1991  Mahoney ............................. 371/22.3
5,109,383  4/1992  Chujo ................................ 371/22.3

FOREIGN PATENT DOCUMENTS 0292116  11/1988  European Pat. Off. .
3772615   2/1988  Germany .
3743586   7/1988  Germany .

Primary Examiner—Vincent P. Canney
Attorney, Agent, or Firm—Greer, Burns & Crain, Ltd.

[57] ABSTRACT

A flip-flop circuit comprising serially connected flip-flops is associated with a combination circuit and configures a scanning circuit for performing a scanning operation in order to test the combination circuit in a test mode. In performing the scanning operation, the flip-flop circuit is preset or cleared and the preset or cleared data is scanned out through the scanning circuit so that the failure of an asynchronous system input circuit connected to a preset or clear terminal of the flip-flop circuit is detected.

10 Claims, 9 Drawing Sheets

| CLOCK SIGNAL AT TERMINAL 15 | PRESET SIGNAL AT TERMINAL 18 | DATA RECEIVED AT TERMINAL 14 | OUTPUT Q AT TERMINAL 19 |
|---|---|---|---|
| ↑ | 1 | D | D |
| X | 0 | X | 1 |

Fig. 3

FLIP-FLOP CIRCUITS FOR TESTING LSI GATE ARRAYS

This application is a continuation of U.S. patent application Ser. No. 07/710,829, filed Jun. 5, 1991, now abandoned.

BACKGROUND OF THE INVENTION

This invention pertains to flip-flops in the scanning design method used in designing LSI logic units.

As the circuit size of single LSI chips increase, the time from logic designing to completing test designing during the designing period also increases, and a so-called "simplified designing" method is needed. Although scan designing represents one of such "simplified designing" methods, there has been no way to detect a failure in the "scanning circuit". Thus a means capable of detecting failures simply and certainly has been needed.

DESCRIPTION OF THE RELATED ART

When an LSI chip having gate arrays of up to one hundred thousand (100,000) gates is designed in a short period of time, it becomes necessary to shorten the test designing period. Since it takes a lot of steps to manually design test patterns having superior failure detection rates, designing methods for test simplification are proposed.

A logical operation circuit comprises a sequential circuit and a combinatorial circuit.

A method of checking failures in a combination circuit is already established. For example, D algorithm or PODEM enables such automatic checks.

On the other hand, a circuit containing a sequential circuit, such as a flip-flop, has an undetermined output, even if its input is determined. This is because, to determine its output, it is necessary to prestore such values as initial values in the sequence circuit.

One of the methods for checking a circuit including such a sequence circuit is the scan designing method. Per the scan designing method, flip-flops contained in a logical operation circuit are connected serially, and a scan signal is provided from outside to an input of the flip-flop in the first stage. Since the scan signals sequentially shift the flip-flops and reach the flip-flop in the last stage, a logical operation circuit can check a combination circuit with the shifted value, if the scan signal can be detected to reach the final stage. Here, "a combination circuit" designates a circuit having definite outputs, which do not change unless its input signals change, unique to the combinations of its input signals.

FIG. 1 illustrates the scan designing method and shows the configuration of a logical operation circuit comprising both a sequential circuit and a combinatorial circuit. The sequence circuit comprises flip-flops 6, 7 and 8 (flip-flop 1, flip-flop 2 and flip-flop 3). A scanning circuit 2 comprises a scan-in terminal 3 and a scan-out terminal 4. The scanning circuit 2 is so connected that the combination circuit 5 is logically separated from flip-flops 6, 7, and 8, while the combination circuit 5 is inspected. That is, flip-flops 6, 7, and 8 do not receive outputs from the combination circuit 5 during its inspection. As a result, since flip-flops 6, 7 and 8 (FF1, FF2 and FF3) act similarly to shift registers, it becomes possible to treat the output point of flip-flop 6 (FF1) and the input point of flip-flop 8 (FF3) respectively as the signal input pin of the combination circuit 5 and the signal output pin of the combination circuit 5. Consequently, instead of testing the logic operation circuit entirely, it is only necessary to repeat a simple test of every "combination circuit" to identify the existence of a failure.

FIG. 2 shows, in further detail, above described flip-flops 6, 7 and 8, i.e. Flip-Flop 1, Flip-Flop 2 and Flip-Flop 3. In FIG. 2, 9 is a flip-flop, 10 is a flip-flop in the preceding stage, 11 is a scan-in signal terminal, 12 is a terminal for receiving a scanning action control signal, 13 and 23 are NAND gates, 14 is a data terminal, 15 is a terminal for receiving a clock signal, 16 is a terminal for a clear signal CR, a terminal 17 of flip-flop 9 is for receiving the clear signal CR, a terminal 18 of flip-flop 9 is for receiving a preset signal PR, and a terminal 19 of flip-flop 9 transmits the output signal Q. Flip-flops 20 and 21 are serially connected flip-flops where the serial connection is logically enabled during a scanning operation. Gate 24 is an AND circuit, and gate 25 is an OR circuit.

During an ordinary operation, a scanning operation control signal terminal 12 receives "1", and NAND circuit 13 is enabled, which causes the inversion of the output from flip-flop 10 to be supplied to terminal 18 for receiving the preset signal PR. Thus, when flip-flop 10 outputs "1" supplied from the preceding stage, "0" is supplied to terminal 18 for receiving the preset signal PR of flip-flop 9 through a NAND circuit 13, which presets flip-flop 9.

FIG. 3 is a table of truth value of flip-flops such as 6, 7, 8 or 9.

When the scanning action control signal is high, the NAND circuit 22 is enabled, so then a combination circuit comprising NAND circuit 23, AND circuit 24, OR circuit 25, etc. may output "0" to the terminal 17 for receiving the clear signal CR, when flip-flop 9 is to be cleared.

Meanwhile, during a scanning action, the scanning action control signal terminal 12 receives "0", NAND circuits 13 and 22 are disabled to output "1". Thus, flip-flop 9 will be neither preset nor cleared any more.

During the scanning action control, flip-flops 10, 20, 21 and 9 shown in FIG. 2 configure logically as serially connected shift registers (F1 through F5 in FIG. 4). The scanning circuit 2 shown in FIG. 1 and described earlier has such a configuration. To be more specific, flip-flops 6, 7 and 8 configure the shift register in FIG. 1.

By storing the target values (SCDATA) in the shift register thus configured by sequentially shifting them, the initial values to be tested are stored in the flip-flops. By starting the operation, the actions of the combination circuit can be confirmed. At this time, the scanning circuit does not operate and is connected to the combination circuit shown in FIG. 4. That is, the intended actions of an LSI for one clock cycle are performed.

When the clock signal CLK received at terminal 15 rises (indicated as " ↑ " in FIG. 3) while retaining the preset signal PR received at terminal 18 "1", if terminal 14 receives data D, the same data D is outputted at output Q. When the preset signal PR is "0", whatever the state of terminal 15 is, output Q is "1".

A failure in an action for a clock signal for scanning is easily detected, since the clock signal is a synchronous signal. However, a failure is more difficult to detect in the circuit of a system asynchronous to the scanning circuit which is connected to an input terminal, such as a circuit supplying the clear signal CR or the preset signal PR, in a scan designing method for testing the performance of a sequence circuit. When scanning actions are being performed, it is difficult to judge whether a failure is indicated because the clear signal CR or the preset signal PR is unchanging, or because a failure.

SUMMARY

An object of the present invention is to provide a flip-flop circuit which increases efficiency in scan designing by detecting failures in the circuits connected to an input circuit of flip-flops.

A feature of this invention resides in providing serially connected flip-flop circuits configuring a scanning circuit for scanning a combination circuit. The scanning circuit is connected to the combination circuit, and the flip-flop circuit detects failures of an asynchronous system input circuit connected to the flip-flop circuits.

The flip-flop circuit configuring a scanning circuit receives a scan-in data at its scan-in terminal, and an output of the flip-flop circuit is provided to a combination circuit which operates in a synchronous manner. Then, the output of the combination circuit is again applied to the flip-flop circuit. Then, the output of the flip-flop circuit is scanned out so that a failure of the combination circuit is detected. An asynchronous system input circuit comprising a combination circuit which operates in an asynchronous manner is connected, for example, to a preset or clear terminal of the flip-flop circuit, so that a failure of the asynchronous system input circuit is detected through a scanning-out operation of the flip-flop circuit.

BRIEF DESCRIPTION OF THE DRAWINGS

FIG. 3 is a table of truth values for the flip-flop circuit shown in FIG. 1;

PREFERRED EMBODIMENTS OF THIS INVENTION

The serially connected flip-flop circuit is associated with a combination circuit and constructs a scanning circuit for scanning the combination circuit. The flip-flop circuit detects failures in an asynchronous system input circuit connected to the flip-flop circuit, when the combination circuit includes a synchronous system input circuit providing the input to the data terminal of the flip-flop circuit, and an asynchronous system input circuit providing the input to the preset or clear terminal of the flip-flop circuit.

The flip-flops in the scanning circuit can be controlled to receive or not to receive data supplied by asynchronous system input signals in synchronization with clock signals. That is, the configuration enables a slave latch unit to be preset or cleared independently of presetting or clearing its master latch unit, where both the slave latch unit and the master latch unit are in the same flip-flop circuit. When the master latch unit of a flip-flop receives an asynchronous preset signal or a clear signal, an asynchronous system input signal is supplied to the slave latch unit of the same flip-flop, so that an expected output signal is obtained at the output of the latches. If an output signal other than the expected output signal is obtained, a failure in the asynchronous system input circuit is detected.

Figure 5:
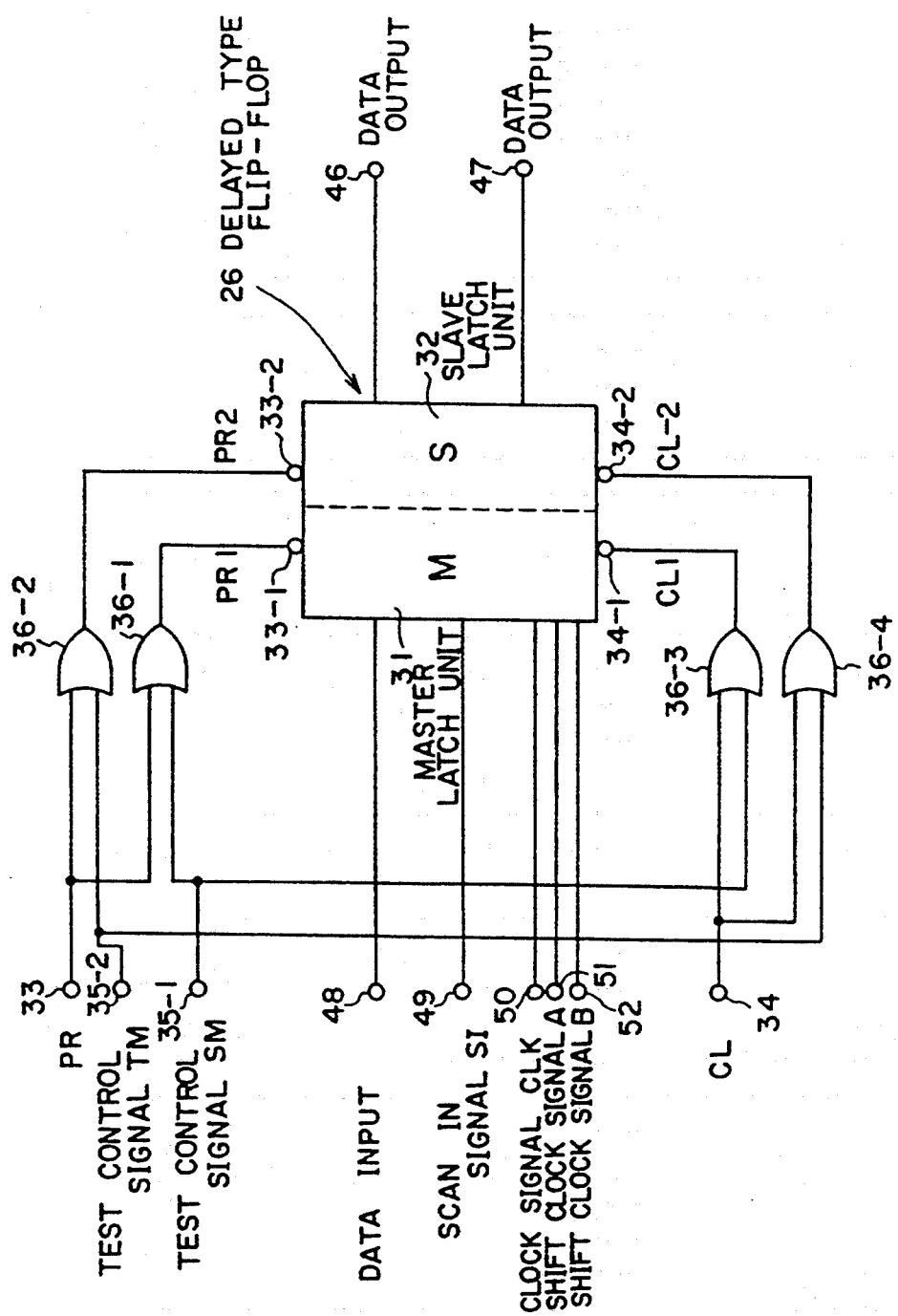
FIG. 5 illustrates the configuration of a first embodiment of this invention.

FIG. 5 illustrates a case in which a common delayed type flip-flop is used. In FIG. 5, 26 is a flip-flop in the scanning circuit; 31 is a master latch unit of flip-flop 26; 32 is a slave latch unit of flip-flop 26; 33-1 and 33-2 are terminals for receiving the preset signal PR respectively for the master latch unit 31 and the slave latch unit 32 in flip-flop 26; 34-1 and 34-2 are terminals for receiving the clear signal CL respectively for the master latch unit 31 and the slave latch unit 32 in flip-flop 26; 35-1 and 35-2 are terminals for receiving test control signals; 36-1 through 36-4 are OR operation circuits, 48 is a data input terminal; 49 is a scan-in input terminal; 50 is a clock signal input terminal; 51 and 52 are input terminals of shift clock signals A and B; 46 is a terminal Q for data output; and 47 is a terminal $\overline{Q}$ for data output. Flip-flop 26 operates ordinarily as a delayed type flip-flops when clock signals are provided to a terminal 50 for clock signal CLK. That is, when clock signal CLK is "1", the master latch unit 31 inputs data D supplied from the data input terminal 48 and fixes the value when clock signal CLK changes from "0" to "1".

When scanning actions are tested, by supplying e.g. "1" to the terminals 35-1 and 35-2 for receiving test control signals, irrespective of signals supplied to terminal 33 for receiving the preset signal PR or terminals 34 for receiving the clear signal CL, operation of a shift register is maintained by OR circuits 36-1 through 36-4, the master latch unit 31, and the slave latch unit 32, each receive "1" at their preset PR and clear CL inputs. At this time, nothing is cleared or preset in the slave latch unit 32.

Next, when terminal 35-1 for receiving test control signal is supplied with "0", the master latch unit 31 can be preset or cleared, and it is only the master latch unit 31 that can be preset or cleared. As a result, "1" is supplied again to enable shifting to the succeeding stage of flip-flop 26. If earlier set data are then shifted, and received by all the flip-flops, it is then known that the asynchronous system signal circuit is in good working order. The asynchronous system signal comprises a combination circuit which produces an asynchronous system signal to the flip-flops.

Figure 6:
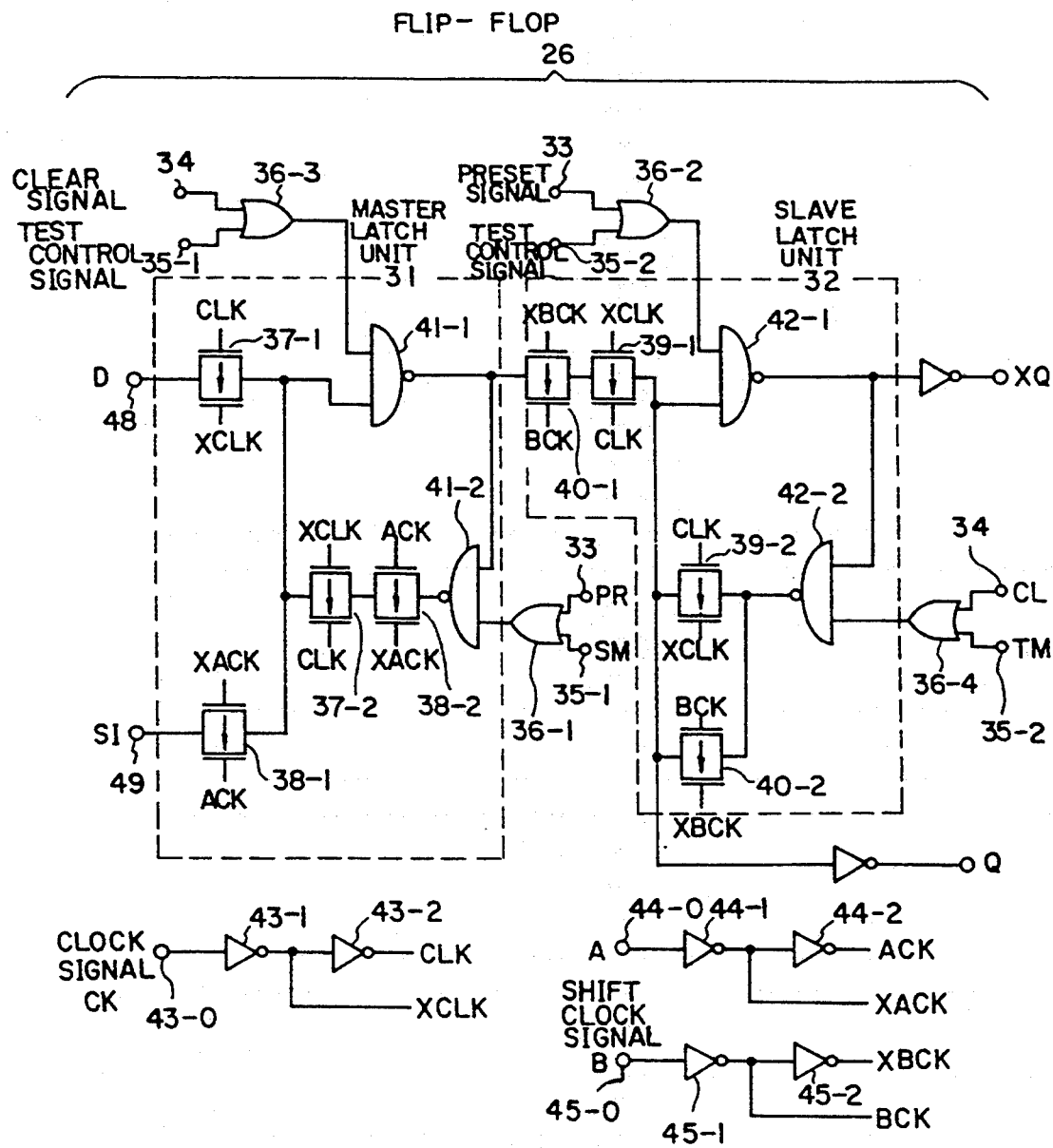
FIG. 6 shows, in further detail, the configuration shown in FIG. 5.

FIG. 6 illustrates in further detail the configuration shown in FIG. 5. The slave latch unit 32 and the master latch unit 31 of delayed type flip-flop 26 in FIG. 6. Both consist of transmission gates and logical operation circuits. In FIG. 6, transmission gates 37-1 and 37-2 in the master latch unit 31 respond to the clock signal CK. Transmission gates 38-1 and 38-2 in the master latch unit 31 respond to shift clock signal A. Transmission gates 39-1 and 39-2 in the slave latch unit 32 respond to shift clock signal CK. Transmission gates 40-1 and 40-2 in the slave latch unit 32 respond to clock signals for shift registers B. 41-1 and 41-2 are logical operation circuits in the master latch unit 31. 42-1 and 42-2 are logical operation circuits in the slave latch unit 32. 35-1 and 35-2 are terminals for receiving test control signals. Note here that transmission gates 37-1, 38-1, 39-1 and 40-1 are off, when transmission gates 37-2, 38-2, 39-2 and 40-2 are on, and that transmission gates 37-1, 38-1, 39-1 and 40-1 are off, when transmission gates 37-2, 38-2, 39-2 and 40-2 are on.

The transmission gates 37-1 through 40-2 and the logical operation circuits 41-1 through 42-2 together configure the latch units 31 and 32 encircled by dashed lines. The clock signals supplied from terminal 43-0 ordinarily cause delayed type flip-flop operations. Hence, terminal 35-1 for receiving test control input signal SM, terminal 35-2 for receiving test control input signal TM, and terminals 44-0 and 44-0 for receiving shift clock signals A and B are all set to "0". While clock signal CK is in "0", the master latch unit 31 receives data input D, which is transmitted to the slave latch unit 32 when clock signal CK rises, and data Q and XQ are outputted from terminals 46 and 47.

To go into detail, the transfer gates 37-1 through 40-2 are on when supplied with voltages of reverse polarities to the arrow direction.

When clock signal CK is "0", clock signal CLK is "0", clock signal XCLK is "1" and transfer gate 37-1 is on, the last of which causes a NAND gate 41-1 to receive the binary value of input D. If a NAND gate 41-1 is on (i.e. if the master latch 31 is not cleared), a complementary binary value is output from NAND gate 41-1. When the master latch 31 is not preset, NAND gate 41-2 reverses the binary value again, which causes the binary value to revert to the same as the original one.

Since shift clock signal A is ordinarily "0", transfer gate 38-2 is turned on. Therefore, transfer gate 37-2 receives the same binary value as the input. This change causes the already inputted binary value to be received, which is independent of later inputted binary values.

The binary value outputted from NAND gate 41-1 (the received binary value) is the reversed or the complementary binary value of D and is supplied to the slave latch unit 32. At this time, clock signal CK is "1", and both shift clock signal A and shift clock signal B are "0".

Therefore, transfer gates 40-1 and 39-1 are on, and transfer gates 40-2 and 39-2 are off. When a preset is not enabled, since NAND gate 42-1 is on, its output is the same as the binary value received by the master latch unit 31( which is the complement of the memorized binary value). Output XQ is the complement of the received binary value. Output Q is the same as the received binary value. At this state, even if clock signal CK changes to "0", the slave latch unit 32 receives the binary value received from the master latch unit 31, in a similar way to the master latch unit 31.

As described above, by having clock signal CK repeat "0" and "1", the master latch unit 31 and the slave latch unit 32 sequentially shift the received binary values.

Figure 7:
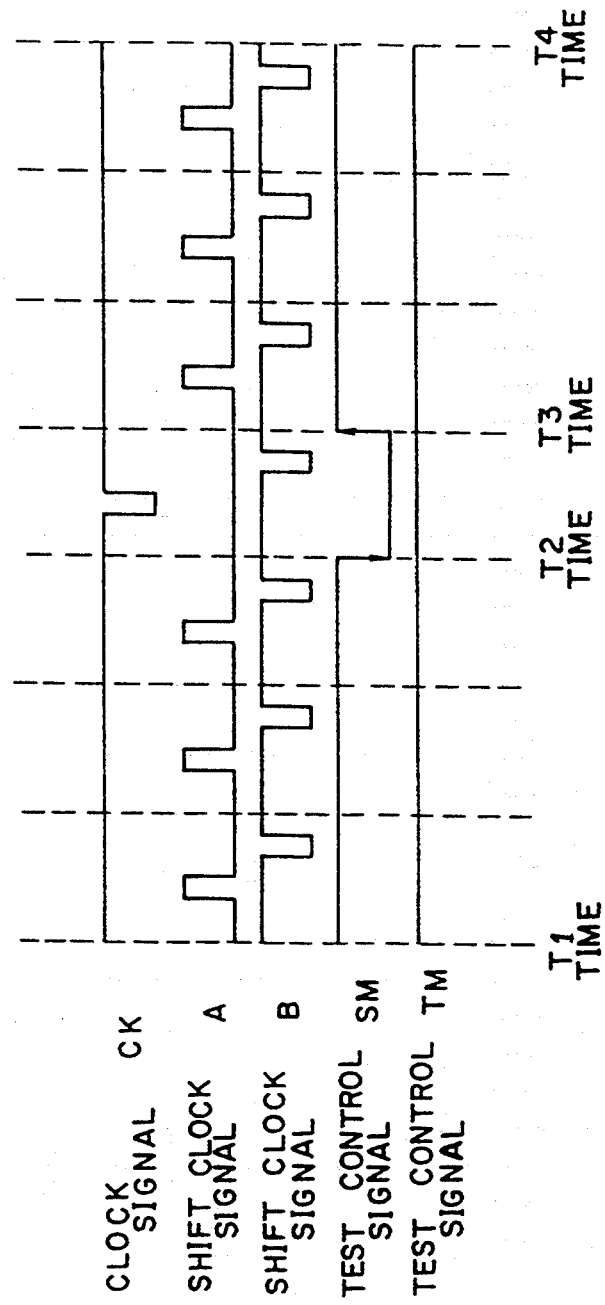
FIG. 7 shows the operating waveforms shown in FIG. 6.

Next, during operations as a shift register, as shown in FIG. 7, shift clock signals A and B are supplied to terminals 44-1 and 44-2 for receiving shift clocks A and B having a phase difference of about one-hundred eighty (180) degrees and a timing difference at least equivalent to one pulse. Meanwhile, as described later as a serial-in serial-out mode, clock signal CK remains at "1", and since test control signals SM and TM are "1", transfer gates 37-2 and 39-1 are on and transfer gates 37-1 and 39-2 are off, and NAND gates 41-1, 41-2, 42-1 and 42-2 are on. Hence, upon receipt of shift clock signal A being "1", the master latch unit 32 receives scan in signal SI, and the binary value at that time is latched (i.e. received) on receiving "0". Then, the slave latch unit 32 is inputted with this binary value when shift clock signal B is "0", and receives it when shift clock signal B is "1".

When a scanning test is performed, there are two operating modes, namely, the serial-in serial-out mode and the parallel-in and parallel-out mode. In FIG. 7, the serial-in serial-out mode is used between times T1 and T2. At this time, by supplying "1" to the terminals 35-1 and 35-2 for receiving test control signals SM and TM, data is transmitted from terminal 49 (the terminal for receiving scan-in signal SI) shown in FIG. 6 to the master latch unit 31. In this case, irrespective of the signals received at the terminals for receiving a clear/preset signal input, operation as a shift register is performed properly.

The parallel-in parallel-out mode is used between times T2 and T3. This mode is created, by supplying "0" to terminal 35-2 for receiving test control signal SM and "1" to terminal 35-2 for receiving test control signal TM. When a pulse is only once supplied to terminal 43-0 for receiving clock signal CK only the master latch unit 31 latches a clear/preset signal input.

After time T3, the operating mode reverts to the serial-in serial-out mode. Data received by respective flip-flops is transmitted on receiving clock signals A and B, to terminal 46 for transmitting data outputs XQ and the data is then available for testing the combinatorial circuits.

The above description can be summarized as follows: The period between times T1 and T2 is put in the serial-in serial-out mode, and the values to be tested are stored serially. The period between times T2 and T3 is put in the parallel-in parallel-out mode, and by performing an asynchronous system circuit action, such as presetting or clearing, the result is stored in the slave latch unit 32. The period after time T3 is put back in the serial-in and serial-out mode and the above result is read again to be confirmed.

By repeating these control procedures, failures in clear/preset signal circuits can be detected. That is, when terminal 34 for receiving the clear signal CL of flip-flop 26 is at "0", the master latch unit 31 of flip-flop 26 is set to "0" during the parallel-in parallel-out mode. However, during the serial-in serial-out mode, since 35-1 and 35-2 for receiving test control signal SM receives "1", the state of flip-flop 26 does not change. Since the slave latch unit 32 is read in synchronization with clock signal CK in the serial-in serial-out mode, if a clear/preset signal input supplied in synchronization with clock signal CK is read correctly, the clear/preset signal circuits are detected to be working correctly.

Figure 1:
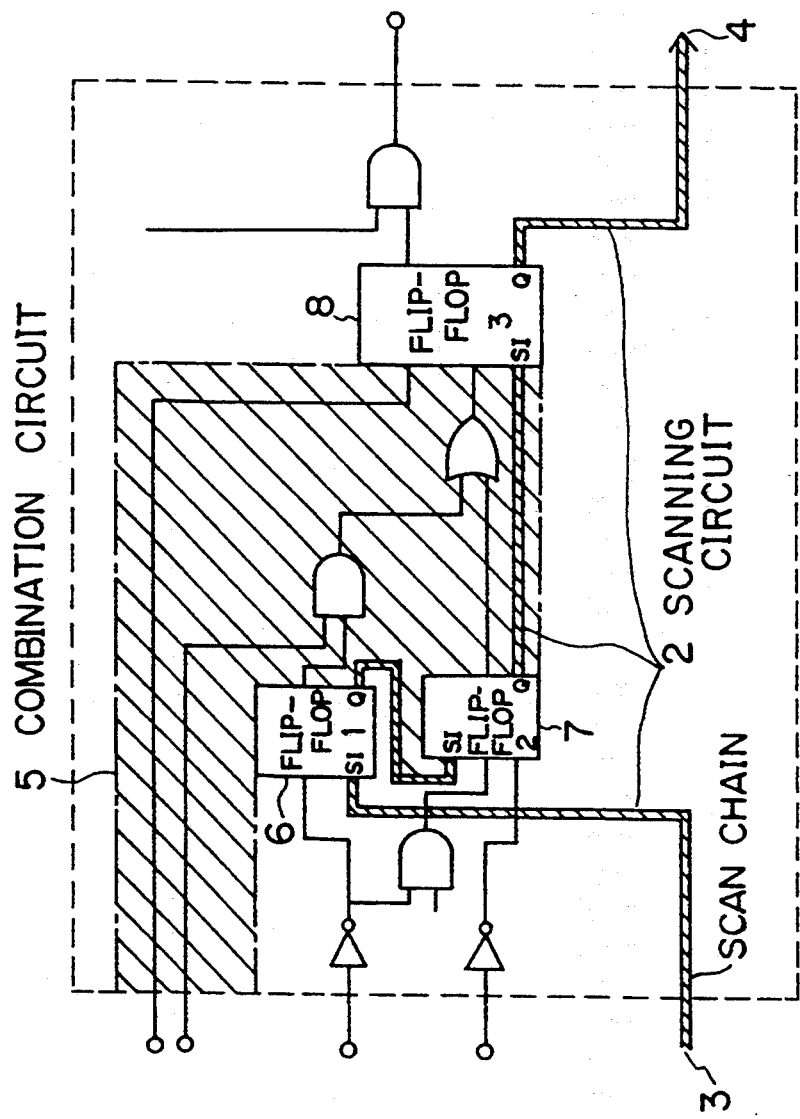
FIG. 1 illustrates a conventional scan designing method.
Figure 2:
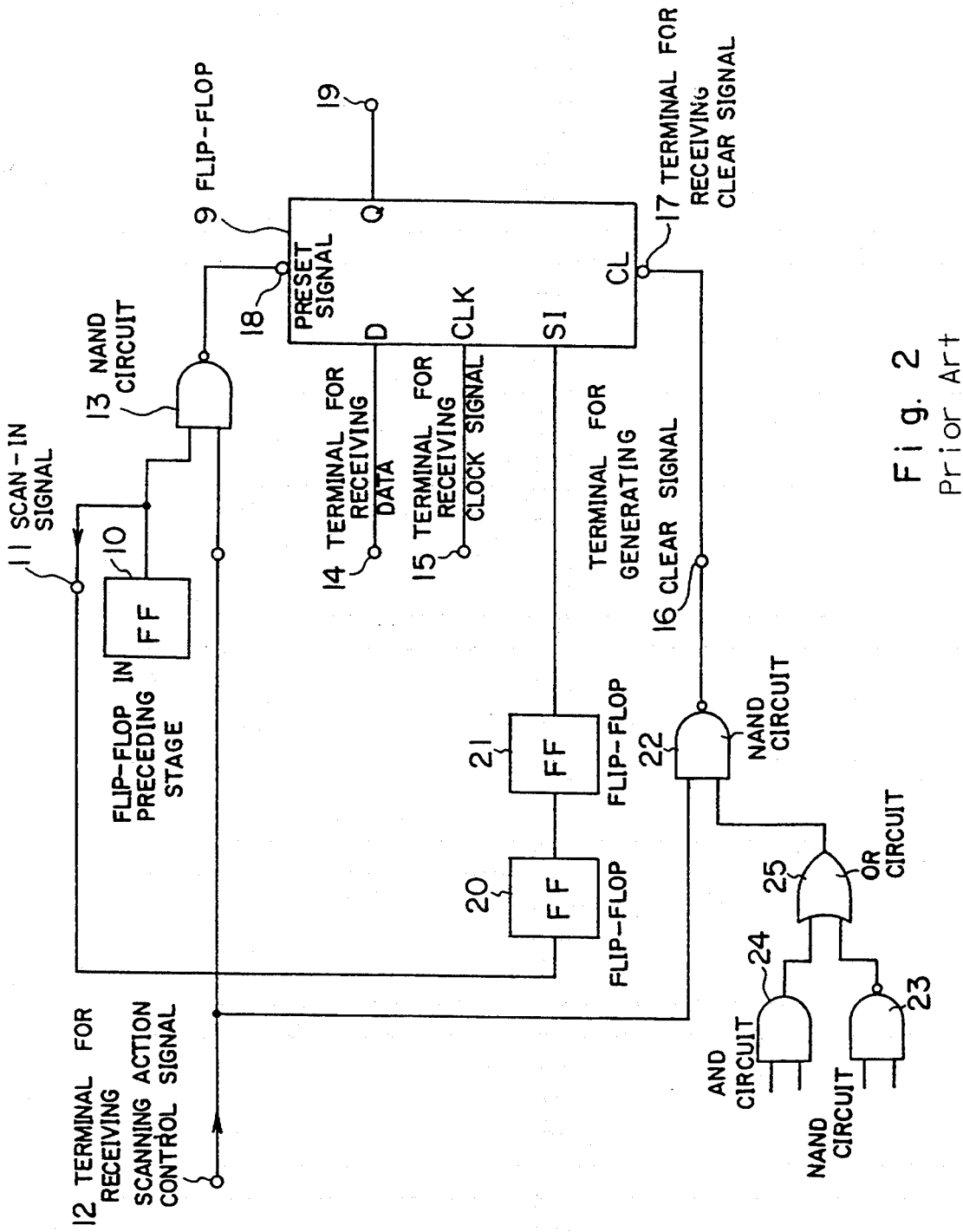
FIG. 2 illustrates in detail the flip-flip circuit shown in FIG. 1.
Figure 4:
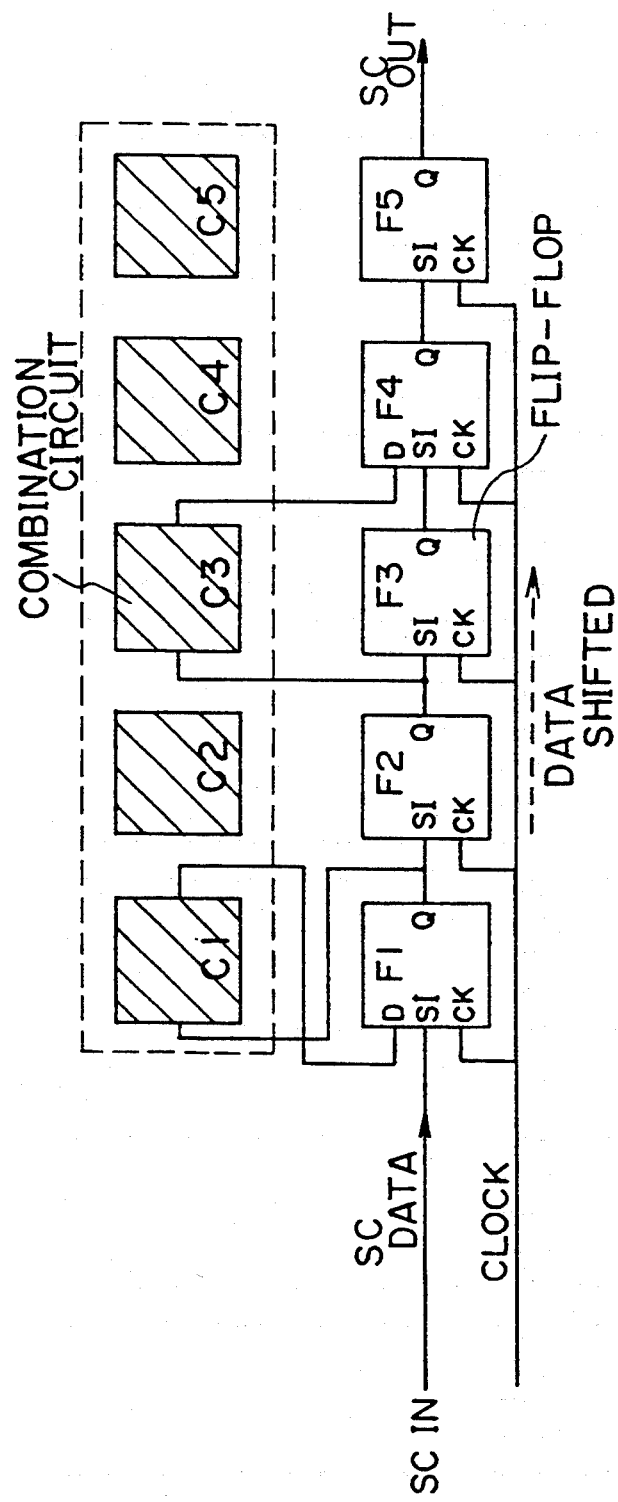
FIG. 4 shows a connection between flip-flops and a combination circuit when it is scanned.
Figure 8:
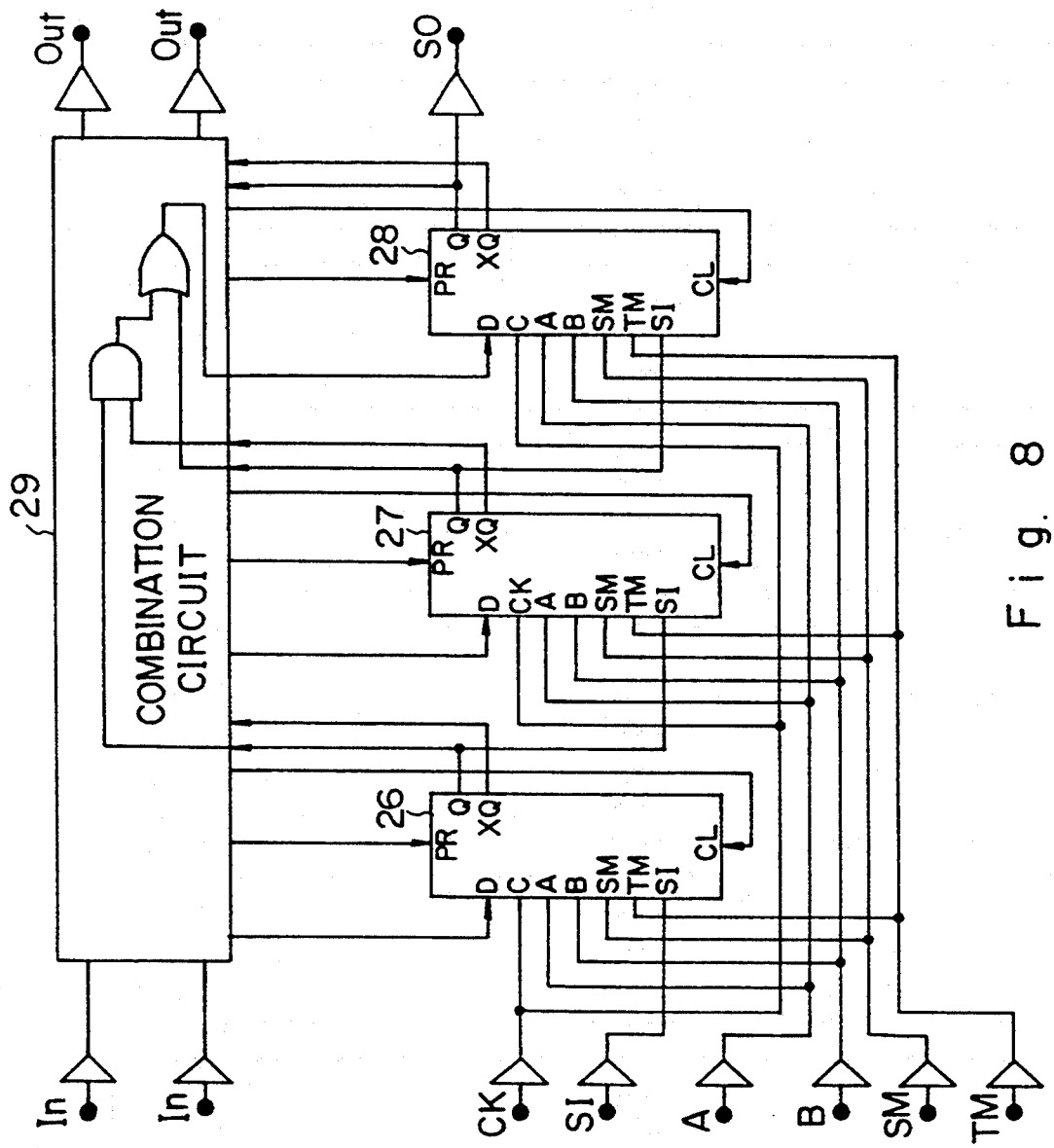
FIG. 8 shows the configuration of a second embodiment of this invention.

FIG. 8 shows the connection of serially connected three stage flip-flops. In FIG. 8, 26, 27 and 28 are all delayed type flip-flops, 29 is a combination circuit e.g. similar to the combination circuit 5 shown in FIG. 1. When respective flip-flops are used as shift registers, the signal inputted from the terminal for serial-in SI reaches terminal SI of flip-flop 27 in the succeeding stage from the terminal of output Q of flip-flop 26, and the signal inputted from the terminal for serial-in SI in flip-flop 27 reaches the terminal for serial-in SI of flip-flop 28 in the next succeeding stage from the terminal for output Q of flip-flop 27. Terminal SO receives a scan-out signal from the terminal for output Q of flip-flop 28. Terminal SO is an output signal terminal for scanning when LSI is checked, i.e. during a scanning action. A combination circuit 29 is supplied with predetermined signals to input terminals In of the combination circuit 29, so that the signal from the terminal for output Q of each flip-flop is transmitted to the terminal for serial-in SI in the succeeding stage. Next, if signals are supplied from the terminals for test control signals SM and TM, and clock signal CK and shift clock signals A and B are used, as described earlier, it becomes possible to detect failures in clear/preset signal circuits.

Figure 9:
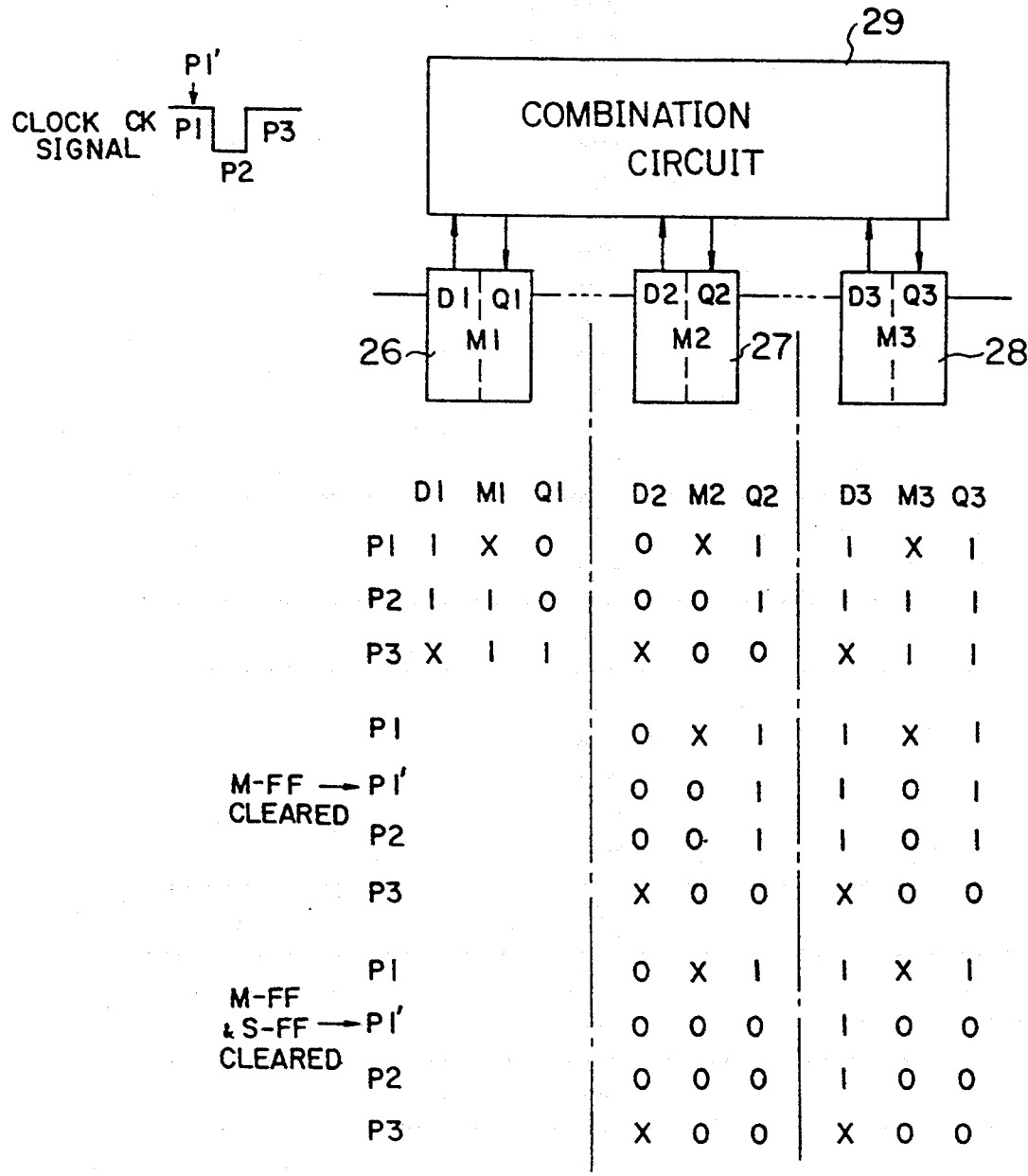
FIG. 9 shows the logical outputs from the combination circuit used in the second embodiment shown in FIG. 8.

FIG. 9 illustrates how the master latch unit 31 and slave latch unit 32 shown in FIG. 8 change their outputs in correspondence with the changes in their inputs. Flip-flop 26 is explained first. Input D1 is "1" at phase P1. At this time, the master latch unit 31 has not received an input, and is in a pre-existing state. (The state is expressed as X, because it is not definite.) At phase P2, i.e. when clock signal is "0", the master latch unit 31 receives data and its output (M1) becomes "1".

Then, in phase P3, the slave latch unit 32 receives "1", and its output (Q1) becomes "1". In phase P3, after clock signal CK rises, no matter how input D1 changes, its output remains "1". This is similar for flip-flops 27 and 28. FIG. 9 shows a case where flip-flop 27 receives "0" in phase P1 and output Q is "1", and a case where flip-flop 29 receives "1" and output Q is "1".

Meanwhile, when only master latch unit 31 of flip-flops 27 and 28 are cleared (M-FF cleared in FIG. 9), i.e. when test signal SM is set to "0", and test signal TM is set to "1", outputs M2 and M3 from the master latch unit 31 are always "0", irrespective of inputs D2 and D3. This state continues in phase P2, and the slave latch unit 32 receives the state in phase P3, and its outputs Q2 and Q3 become both "0".

When the master latch unit 31 and the slave latch unit 32 are both cleared, the respective outputs from the master latch unit 31 and the slave latch unit 32 change simultaneously to 0 in phase P1', irrespective of the previous inputs or values memorized before.

Through the above operations, when only the master latch unit 31 is cleared, the master latch unit 31 receives the clearing result. Consequently, by changing the mode to the serial-in serial-out mode thence, the position of the object serial data is cleared and thusly has the value "0", which ascertains the normal operation. This is similar to a preset case.

Accordingly, this invention enables failures in signal supplied from an asynchronous system input terminal to flip-flop circuits used for scanning to be promptly detected.

What is claimed is:

1. A flip-flop circuit comprising:
    a serially connected flip-flop circuit including a flip-flop having synchronous and asynchronous flip-flop terminals associated with a combination circuit and configuring a scanning circuit for testing said combination circuit;
    gate means provided between said serially connected flip-flop circuit and an asynchronous system input circuit that is connected to an asynchronous terminal of said flip-flop for controlling a signal from said asynchronous system input circuit which determines an output of said serially connected flip-flop circuit; and
    means for detecting failures of said asynchronous system input circuit using said gate means during a scanning test through said scanning circuit;
    said flip-flop circuit having a master latch flip-flop unit and a slave latch flip-flop unit respectively equipped with at least either a clear terminal or a preset terminal as said asynchronous terminal.

2. The flip-flop circuit according to claim 1 wherein:
    said master latch flip-flop unit and said slave latch flip-flop unit each includes a gate circuit receiving, at either said clear terminal or said preset terminal, either a clear signal or a preset signal supplied from the outside by turning its gate on or off.

3. The flip-flop circuit according to claim 1, wherein:
    said asynchronous system input circuit is a combination circuit connected to at least either said clear terminal or said preset terminal of said flip-flop.

4. The flip-flop circuit according to claim 1, wherein:
    said master latch unit and said slave latch unit are cleared or preset independently.

5. A semiconductor integrated circuit comprising a combination circuit and a scanning circuit;
    said scanning circuit being connected to said combination circuit, said scanning circuit comprising
    a plurality of serially connected flip-flops having asynchronous and synchronous flip-flop terminals, said asynchronous terminals including at least a pre-set terminal and a clear terminal, and
    an asynchronous system input circuit connected to said asynchronous flip-flop terminals for controlling a signal from said asynchronous system input circuit which determines an output of said serially connected flip-flops and for scanning said combination circuit;
    said semiconductor integrated circuit detecting failures in said asynchronous system input circuit by co-operating with said gate circuit during a scanning test.

6. A semiconductor integrated circuit according to claim 5, wherein:
    said asynchronous system input circuit is a combination circuit connected at least to either said clear terminal or said preset terminal of one of said flip-flops.

7. A semiconductor integrated circuit according to claim 5, wherein:
    said flip-flops include a master latch flip-flop unit and a slave latch flip-flop unit respectively equipped with at least either said clear terminal or said preset terminal as an asynchronous flip-flop terminal;
    said master latch flip-flop unit and said slave latch flip-flop unit each including a gate circuit receiving, at either said clear terminal or said preset terminal, either a clear signal or a preset signal supplied from the outside by turning its gate on or off in correspondence with the mode.

8. A semiconductor device comprising
    at least one combinational circuit having a plurality of gates,
    at least one sequential circuit having a plurality of flip-flops, said flip-flops having synchronous inputs and asynchronous inputs,
    at least one of said flip-flops having a master latch unit and a slave latch unit,
    the master latch unit having at least one master latch synchronous data input, a synchronous scan test signal input, at least one master latch asynchronous input and at least one master latch synchronous output,
    the slave latch unit having at least one slave latch synchronous data input which is responsive to said master latch synchronous output, at least one slave latch asynchronous input and at least one slave latch synchronous output;

means for scan testing said combinational circuit and said sequential circuit, said scan testing means having means for testing said asynchronous signal inputs of said flip-flops, said means for testing said asynchronous signal inputs including a set of gates, each of said gates having an output connected to one asynchronous input of said master latch unit or one asynchronous input of said slave latch unit, a first input responsive to an asynchronous input signal, and a second input responsive to a test control signal, said second inputs of said master latch unit gates being responsive to a first said test control signal, and said second inputs of said slave latch unit gates being responsive to a second said test control signal.

9. A method of testing a semiconductor device, the semiconductor device having at least one combinational circuit and at least one sequential circuit, the sequential circuit having a plurality of synchronous inputs and a plurality of asynchronous inputs, said asynchronous inputs including at least either a preset terminal or a clear terminal comprising the steps of scan testing the combinational circuit, scan testing the synchronous inputs of the sequential circuits, and scan testing the asynchronous inputs of the sequential circuits, including said preset terminal or said clear terminal.

10. A semiconductor device comprising at least one combinational circuit having a plurality of gates, at least one sequential circuit having a plurality of flip-flops, said flip-flops having synchronous inputs and asynchronous inputs, at least one of said flip-flops having a master latch unit and a slave latch unit, the master latch unit having a least one master latch synchronous data input, a synchronous scan test signal input, at least one master latch asynchronous input and at least one master latch synchronous output, the slave latch unit having at least one slave latch synchronous data input which is responsive to said master latch synchronous output, at least one slave latch asynchronous input and at least one slave latch synchronous output, and said asynchronous inputs of said master latch unit including a master latch preset input and a master latch clear input, said asynchronous inputs of said slave latch unit including a slave latch preset input and a slave latch clear input, said asynchronous input testing means including a first gate having an output connected to said master latch preset input, said first gate producing an output in response to a master latch preset signal or a first test control signal, a second gate having an output connected to said master latch clear input, said second gate producing said output in response to a master latch clear signal or said first control signal, a third gate having an output connected to said slave latch preset input, said third gate producing an output in response to a slave latch preset signal or said second control signal, and a fourth gate having an output connected to said slave latch clear input, said fourth gate producing an output in response to a slave latch clear signal or said second control signal.

* * * * *

UNITED STATES PATENT AND TRADEMARK OFFICE
CERTIFICATE OF CORRECTION

PATENT NO. : 5,440,569
DATED : August 8, 1995
INVENTOR(S) : Naito

It is certified that error appears in the above-indentified patent and that said Letters Patent is hereby corrected as shown below:

Column 2, line 40, delete "-" and insert --a space thereof--.

Column 1, line 12, delete "increase" and insert --increases--.

Column 3, line 4, after "because" insert --of--.

Column 5, line 14, delete "and 44-0" and insert --and 45-0--.

Signed and Sealed this

Twenty-seventh Day of May, 1997

Attest:

BRUCE LEHMAN

Attesting Officer

Commissioner of Patents and Trademarks